United States Patent
Hsieh et al.

(10) Patent No.: US 10,269,581 B2
(45) Date of Patent: *Apr. 23, 2019

(54) METHOD OF FABRICATING A SEMICONDUCTOR STRUCTURE

(71) Applicant: Taiwan Semiconductor Manufacturing Company, Ltd., Hsinchu (TW)

(72) Inventors: Tzu-Yen Hsieh, Taipei (TW); Ming-Ching Chang, Hsinchu (TW); Chia-Wei Chang, Taichung (TW); Chao-Cheng Chen, Hsinchu (TW); Chun-Hung Lee, Hsinchu (TW); Dai-Lin Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/722,405

(22) Filed: Oct. 2, 2017

(65) Prior Publication Data

US 2018/0047585 A1 Feb. 15, 2018

Related U.S. Application Data

(63) Continuation of application No. 14/813,189, filed on Jul. 30, 2015, now Pat. No. 9,779,963, which is a (Continued)

(51) Int. Cl.
*H01L 21/3215* (2006.01)
*H01L 21/3213* (2006.01)
(Continued)

(52) U.S. Cl.
CPC ...... *H01L 21/3215* (2013.01); *H01L 21/0338* (2013.01); *H01L 21/266* (2013.01);
(Continued)

(58) Field of Classification Search
None
See application file for complete search history.

(56) References Cited

U.S. PATENT DOCUMENTS 6,103,603 A 8/2000 Han
6,566,184 B1 5/2003 Wei et al.
(Continued)

OTHER PUBLICATIONS

Masahara, Meishoku, et al., "Ultrathin Channel Vertical DG MOSFET Fabricated by Using Ion-Bombardment-Retarded Etching", IEEE Transaction on Electron Devices, vol. 51, No. 12, Dec. 2004, pp. 2078-2085.

*Primary Examiner* — Mounir S Amer
(74) *Attorney, Agent, or Firm* — Haynes and Boone, LLP

(57) ABSTRACT

A method of making a semiconductor structure, the method including forming a conductive layer over a substrate. The method further includes forming a first imaging layer over the conductive layer, where the first imaging layer comprises a plurality of layers. The method further includes forming openings in the first imaging layer to expose a first set of areas of the conductive layer. The method further includes implanting ions into each area of the first set of area. The method further includes forming a second imaging layer over the conductive layer. The method further includes forming openings in the second imaging layer to expose a second set of areas of the conductive layer, wherein the second set of areas is different from the first set of areas. The method further includes implanting ions into the each area of the second set of areas.

20 Claims, 10 Drawing Sheets

Related U.S. Application Data continuation of application No. 13/366,669, filed on Feb. 6, 2012, now Pat. No. 9,111,861.

(51) Int. Cl.
  *H01L 21/266* (2006.01)
  *H01L 21/033* (2006.01)
  *H01L 21/28* (2006.01)
  *H01L 21/265* (2006.01)

(52) U.S. Cl.
  CPC .. *H01L 21/28026* (2013.01); *H01L 21/28035* (2013.01); *H01L 21/28123* (2013.01); *H01L 21/32134* (2013.01); *H01L 21/32139* (2013.01); *H01L 21/26506* (2013.01)

(56) References Cited

U.S. PATENT DOCUMENTS

| | | |
|---|---|---|
| 6,599,840 B2 | 7/2003 | Wu et al. |
| 2006/0024945 A1 | 2/2006 | Kim et al. |
| 2007/0093017 A1 | 4/2007 | Helm et al. |
| 2007/0105319 A1* | 5/2007 | Furukawa ......... H01L 29/66545 438/266 |
| 2007/0148885 A1 | 6/2007 | Kim et al. |
| 2009/0053880 A1 | 2/2009 | Manabe |
| 2010/0285642 A1 | 11/2010 | Rouh et al. |
| 2011/0111291 A1* | 5/2011 | Koga .................... H01M 4/131 429/209 |

* cited by examiner

METHOD OF FABRICATING A SEMICONDUCTOR STRUCTURE

PRIORITY CLAIM

The present application is a continuation of U.S. application Ser. No. 14/813,189, filed Jul. 30, 2015, issuing as U.S. Pat. No. 9,779,963, which is also a continuation of U.S. application Ser. No. 13/366,669, filed Feb. 6, 2012, now U.S. Pat. No. 9,111,861, each of which is incorporated herein by reference in its entirety.

TECHNICAL FIELD

This disclosure relates generally to integrated circuit fabrication methods, and more particular to a method of fabricating a semiconductor structure.

BACKGROUND

Integrated circuits are commonly used to make a wide variety of electronic devices, such as memory chips. One aim in production is to reduce the size of integrated circuits, so as to increase the density of the individual components and consequently enhance the functionality of an integrated circuit. The minimum pitch on an integrated circuit (the minimum distance between the same points of two adjacent structures of the same type, e.g., two adjacent gate conductors) is often used as a representative measure of the circuit's density. Increases in circuit density often are limited by the resolution of the available photolithographic equipment. The minimum size of features and spaces that a given piece of photolithographic equipment can produce is related to its resolution capability.

Some attempts have been made to try to reduce the pitch of an integrated circuit device below that of the minimum pitch produced lithographically. Generally, multiple exposure and multiple patterning schemes have been used to achieve pitch reduction in semiconductor structures. However, lithographic methods based on multiple exposure and patterning schemes require using complicated multiple layer stacks, and require numerous exposure and etching steps. For example, for the litho-etch-litho-etch (LELE) double patterning process, complicated tri-layer lithographic stack is used. The exposure, etching, re-exposure, and re-etching steps in the LELE scheme produce critical dimension bias and significantly increase the chance for creating defects. In sum, the conventional method of using multiple exposure and patterning schemes to reduce pitch in a semiconductor device are difficult to control and show varying results. It is therefore necessary to provide a simpler, and more reliable method that can reduce the pitch in a semiconductor device.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

Figure 1:
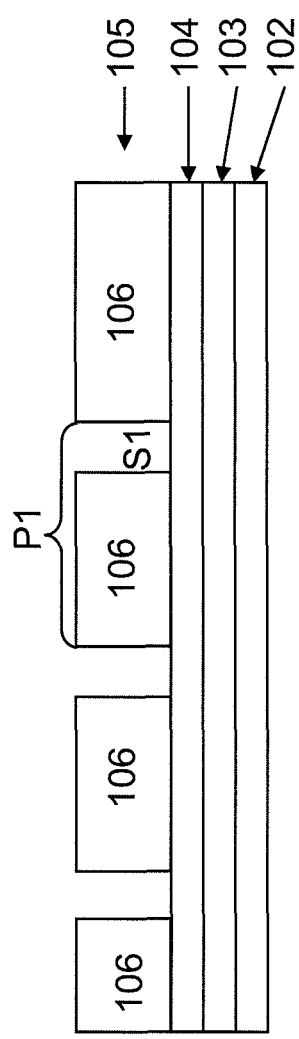
FIGS. 1 to 7 are cross-sectional views showing various stages during fabrication of a structure according to the one embodiment for the present disclosure.

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the invention.

It will be understood that when an element as a layer, region or substrate is referred to as being "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As used herein, a particular patterned layer is "used as a mask" for a particular process step if it is the top layer present when the particular process step is performed, and also if it is only an intermediate layer present when the particular process step is performed, as long as any superposing layers are patterned the same as or more narrowly than the particular layer. In other words, as used herein, if the structure includes two patterned layers, then each of them individually, as well as both of them together, are all considered herein to act as a "mask" for the particular process step. The presence of a superposing layer having the same or narrower pattern as the particular layer does not prevent the particular layer from being "used as a mask" for the particular process step.

FIGS. 1 to 7 are cross-sectional views of a semiconductor structuring during the various process stages according to one embodiment of this invention. The term "substrate" as described herein, refers to a semiconductor substrate on which various layers and integrated circuit components are formed. The substrate may comprise silicon or a compound semiconductor, such as GaAs, InP, Si/Ge, or SiC. Examples of layers may include dielectric layers, doped layers, metal layers, polysilicon layers and via plugs that may connect one layer to one or more layers. Examples of integrated circuit components may include transistors, resistors, and/or capacitors. The substrate may be part of a wafer that includes a plurality of semiconductor dies fabricated on the surface of the substrate, wherein each die comprises one or more integrated circuits. The semiconductor dies are divided by scribe lines between adjacent dies. The following process steps will be performed on each of semiconductor dies on the surface of the substrate.

Referring to the drawings, FIGS. 1 to 7 depict a first embodiment of the integrated circuit pitch reduction method of the present invention.

Referring to FIG. 1, it illustrates the initial step in the first method. In the embodiment depicted in FIG. 1, a semiconductor wafer 100 is shown. Semiconductor wafer 100 is provided with a silicon substrate 102. The term "substrate" as described herein, refers to a semiconductor substrate on which various layers and integrated circuit components are formed. The substrate may comprise silicon or a compound semiconductor, such as GaAs, InP, Si/Ge, or SiC.

Placing directly on the silicon substrate 102 is a gate dielectric layer 103. The gate dielectric layer 103 is formed directly over the substrate 102 by any suitable process to any suitable thickness. In various embodiments, the gate dielectric layer 103 may comprise silicon oxide, silicon oxynitride, silicon nitride, other suitable dielectric materials, a high-k dielectric layer comprising hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof.

A silicon-containing material, such as a polysilicon layer 104, is deposited on the gate dielectric layer 103. The polysilicon layer 104 can be deposited in any known and suitable manner, and is typically deposited with a CVD process from a precursor material such as disilane.

Thereafter, a masking layer over the polysilicon layer 104 is formed. In this embodiment, the masking layer comprises a photoresist layer 105. Alternatively, the masking layer could comprise other patternable materials, which are impermeable to implanted ions. Suitable alternatives include patterned layers formed from a nitride or oxide of silicon and photosensitive polyimide. The process of forming the photoresist layer 105 may include photoresist coating (e.g., spin-on coating), soft baking, mask aligning, exposure, post-exposure baking, developing the photoresist, rinsing, drying (e.g., hard baking), other suitable processes, and/or combinations thereof.

The photoresist layer 105 is formed in such a manner as to cover and mask a selected region of polysilicon layer 104 that has the approximate desired horizontal dimensions of the shaped opening to be formed. Specifically, the patterned first photoresist layer 105 comprises a plurality of first features 106 over the polysilicon layer 104. A pitch P1 is the minimum distance between the same points of two adjacent first features 106. The pitch P1 equals a width W1 of the first feature 106 plus a space S1 between the adjacent first features 106. The region or regions of polysilicon layer 104 that are intended to remain are left unmasked.

Figure 2:
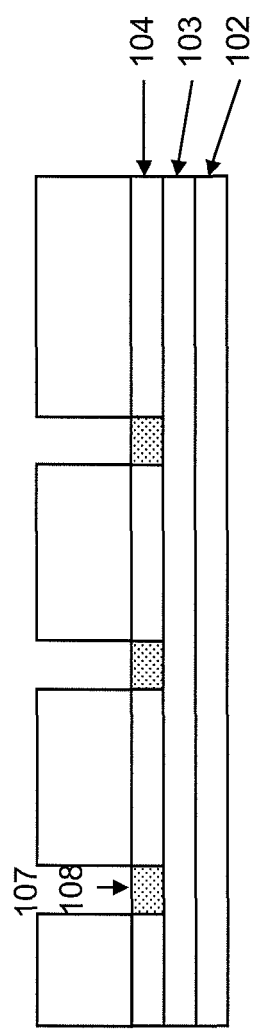

FIG. 2 illustrates the next step in the first method. As shown in FIG. 2, once the polysilicon layer 104 is covered with photoresist mask 105, ions 107 are implanted into the unmasked regions of polysilicon layer 104. The ion implantation operation is conducted with conventional ion implantation methods and the implantation parameters can be varied as discussed more in greater detail below. The ion-implantation can be done using conventional ion implantation apparatus comprising a vacuum chamber and an ion source mounted within the chamber or outside the chamber. A beam of ions can be directed at the targeted area from various directions. In this embodiment, ions 107 are implanted vertically into the polysilicon layer 14. Due to the presence of the photoresist mask layer 105, the ion implantation affects only the portions of the polysilicon layer 104 that is unmasked. Therefore, as FIG. 2 shows, the implantation operation forms evenly spaced ion-implanted features 108 in the polysilicon layer 104; each ion-implanted feature 108 has a width equals to S1.

Figure 3:
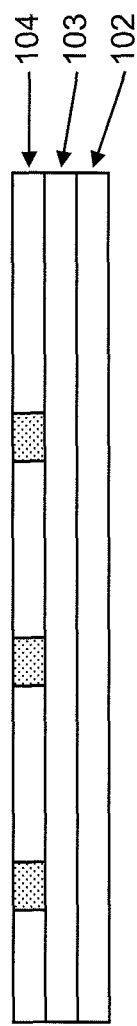

Referring to FIG. 3, once this first ion implantation operation has been conducted, the photoresist mask layer 105 is removed.

Figure 4:
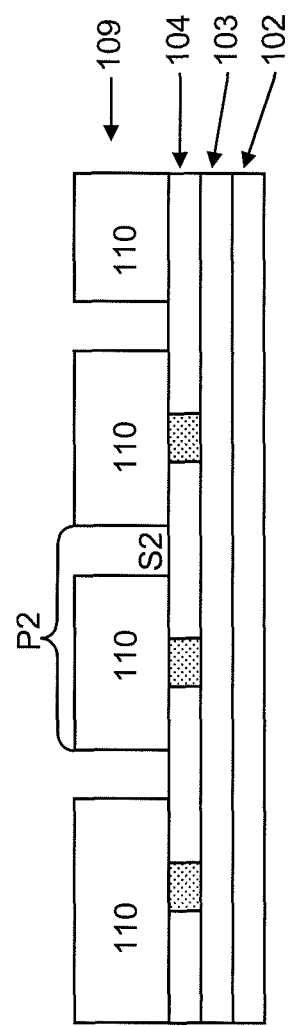

Thereafter, as FIG. 4 shows, a second photoresist mask layer 109 is deposited onto the polysilicon layer 104. Again, this deposition processes may include photoresist coating (e.g., spin-on coating), soft baking, mask aligning, exposure, post-exposure baking, developing the photoresist, rinsing, drying (e.g., hard baking), and/or combinations thereof in various embodiments.

The second photoresist layer 109 is then patterned in a similar fashion to the first photoresist layer 105 to form a plurality of second features 110. The patterned second photoresist layer 109 comprises a plurality of second features 110 over the polysilicon layer 104. Each of the adjacent second features 110 has the pitch P2, the width W2, and the space S2. In this embodiment, the pitch P2 and the first pitch P1 in the previous photoresist layer are substantially equal. In this embodiment, the pitch P2 equals the width W2 of the second feature 110 plus the space S2 between the adjacent second features 110. Also, in this embodiment, spaces S2 of the second photoresist layer 109 expose the portions of the polysilicon layer 104—the portions of the polysilicon layer 104 that will be subject to the second ion-implantation. In other words, the width of space S2 determines the width of the portion of polysilicon layer 104 to be implanted for the second time.

Also, the positioning of the second features 110 in the second photoresist layer 109 is important, because it has a direct impact on the sizing and spacing of the resulting polysilicon features. In this embodiment, the width W2 of the second photoresist feature 110 is set at three times the width S2, and the photoresist feature 110 is positioned on the polysilicon layer 104 such that the widths of the photoresist feature 110 on either side of the previously implanted polysilicon feature 106 in the first photoresist layer 105 are the same. This configuration ensures that all of the resultant implantation-features in the resultant polysilicon layer 14, after two implantation operations, are evenly spaced.

Figure 5:
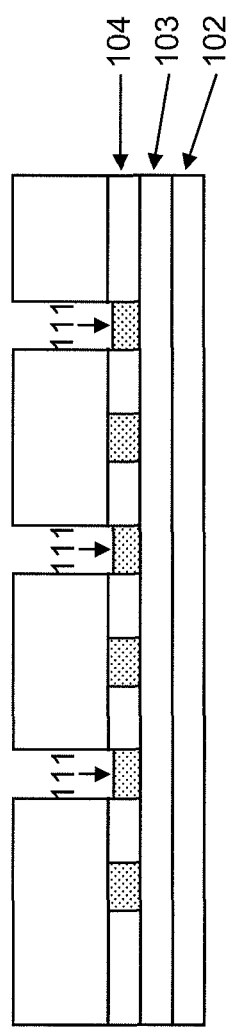

Next, as FIG. 5 shows, the second ion-implantation operation is conducted. The second ion-implantation operation creates a set of second ion-implanted features 111 in the polysilicon layer 104. Due to the careful positioning of the second features 110 in the second photoresist layer and the sizing of the photoresist features 110 described above, the second ion-implanted features 111 should have identical widths (S2) and all of the first and second ion-implanted features 108 and 111 should be spaced evenly apart at a distance equals to one third of W2.

Figure 6:
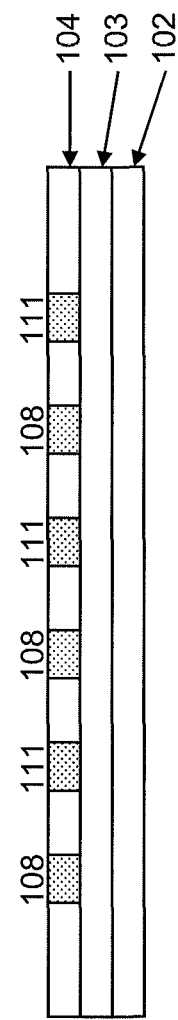

Next, as FIG. 6 shows, the second photoresist layer 109 is then removed, leaving the evenly and alternately spaced ion-implanted features 108 and 111 on the polysilicon layer 104.

Figure 7:
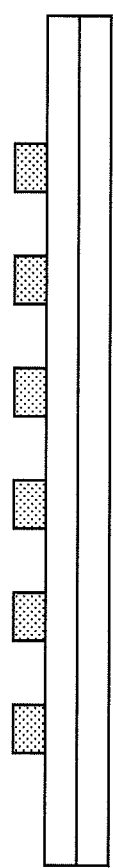

Finally in this embodiment, as FIG. 7 shows, a selective-etching process is conducted to selectively remove the non-implanted portions of the polysilicon layer 104. Specifically, the etching process etches away portions of the volume of silicon-containing material in the polysilicon layer 104 having less than an implanted ion threshold concentration. During this etching process, the etching process does not substantially remove portions of the polysilicon layer 104 implanted with ions above the threshold concentration, such as ion-implanted features 108 and 111. At the same time, however, the portions of the polysilicon layer 104 that have not been implanted with ions, or were implanted to less than the threshold concentration are substantially removed.

As an example, the selective etching of the implanted polysilicon layer 104 is done using tetramethyl ammonium hydroxide (TMAH) wet etch. The TMAH wet etch is preferably administered as an etchant solution into which the entire semiconductor wafer 100 is immersed.

The TMAH etchant solution can be made from various mixtures, including KOH and other alkaline Si solutions. The exemplary concentrations of the TMAH etchant solution comprise from about 2.38 weight percent TMAH in a deionized water solution and higher. In another example, a concentration from about 1 to about 25 weight percent TMAH in a solution, and more preferably about 20 weight percent TMAH in a solution can be used as the TMAH etchant solution. The TMAH wet etching process is preferably done at a temperature in a range from about 10 C to about 90 C, and more preferably, in a range from about 25 C to about 70 C.

In one embodiment, the ion-implanted portions of the polysilicon layer 104 is implanted with a concentration of ions in a range above 1E20 ions per cm3 of the polysilicon layer 104 More specifically, the ion-implantation concentration is in a range above 1E21 per cm3 of polysilicon layer 104. The unimplanted portions of the polysilicon layer 104 should be substantially free of the implanted ions.

Figure 8:
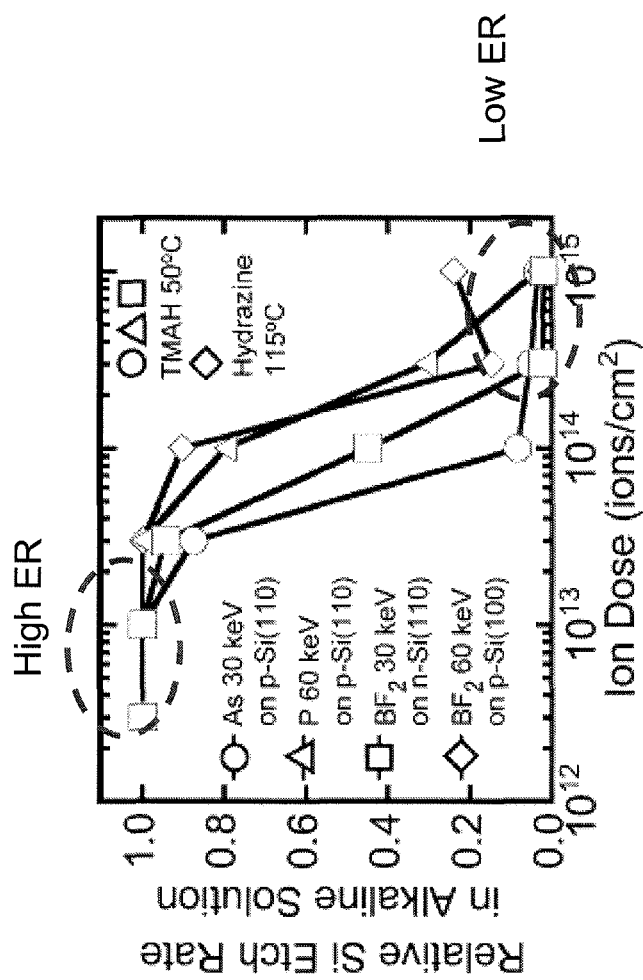
FIG. 8 illustrates the relationship between the amount of ion-implantation in the polysilicon layer and the rate of wet etching in TMAH.

FIG. 8 illustrates the relationship between the amount of ion-implantation in the polysilicon layer and the rate of wet etching using TMAH. The X-axis in FIG. 8 represents the ion implantation concentration, which is given in ions per cm3. The Y-axis in FIG. 8 represents the etching rate of implanted polysilicon layer given in angstroms per minute. FIG. 8 shows that, at or around a concentration of 3E20 ions per cm3 of polysilicon layer, the wet etching rate using TMAH begins to drop drastically from 8000 A/min to 150 A/min. Therefore, it is clear that a high implanted ion concentration will result in a higher wet etch removal rate than a low or non-implanted ion concentration.

When conducting TMAH wet etch, conventional dopant ions that are known to change the electrical properties of the polysilicon layer 104 can be used in the ion implantation operation. For example, the dopant ions can be boron, arsenic, phosphorous, nitrogen, helium, carbon, or difluoroborane. Silicon ions can also be used as ion implantation dopants.

Referring to FIGS. 9 to 15, they depict a second embodiment of the semiconductor structure manufacturing method of the present invention.

Figure 9:
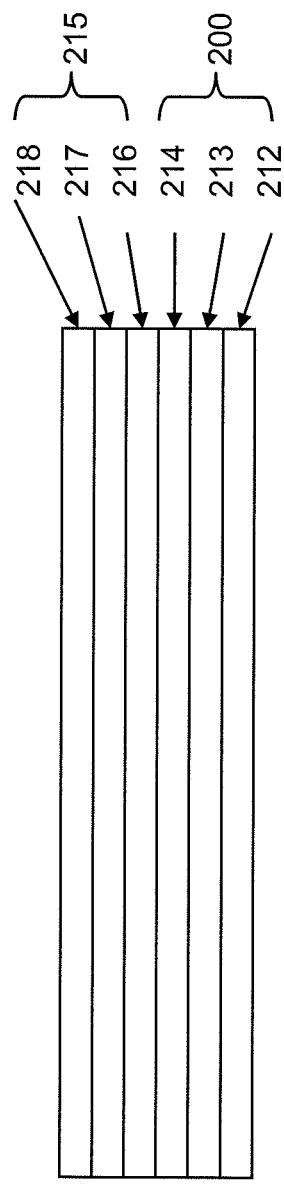
FIGS. 9 to 17 are cross-sectional views showing various stages during fabrication of a structure according to another embodiment for the present disclosure.

In this embodiment, a semiconductor wafer 200 is shown in FIG. 9. Just like the previous embodiment, the semiconductor wafer 200 is provided with a silicon substrate 212, and a gate dielectric layer 213 and a polysilicon layer 214 are subsequently formed on the substrate. Thereafter, an imaging layer 215 is formed on the polysilicon layer 214.

In this embodiment, the imaging layer 215 comprises at least three layers—a bottom layer 216, a middle layer 217, and an upper layer 218. The bottom layer 216 is formed on the hardmask layer and underlying the middle layer 217. The middle layer 217 is formed over the bottom layer 216 and underlying the upper layer 218. The upper layer 218 is formed over the middle layer 217. The bottom, middle, and upper layer 216, 217, 218 comprise various organic and/or inorganic materials.

In this embodiment, bottom layer 216 comprises an organic layer, middle layer 217 comprises an inorganic layer, and upper layer 218 comprises an organic layer. The bottom organic layer may comprise a photoresist material, an anti-reflective coating (ARC) material, a polymer material, and/or other suitable materials. The middle inorganic layer may comprise an oxide layer, such as a low temperature CVD oxide, an oxide derived from TEOS (tetraethylorthosilicate), silicon oxide, or silane oxide. Another example includes the middle layer as a Si-containing anti-reflective coating (ARC) material, such as a 42% Si-containing ARC layer. The upper organic layer may comprise an organic photoresist material. Further, the imaging layers 213, 215, 217 comprise any suitable thickness. In one example, the bottom layer 213 comprises a thickness of approximately 600 to 1000 Å. The middle layer 217 comprises a thickness of approximately 100 to 500 Å. The upper layer 218 comprises a thickness of approximately 550 to 950 Å.

Figure 10:
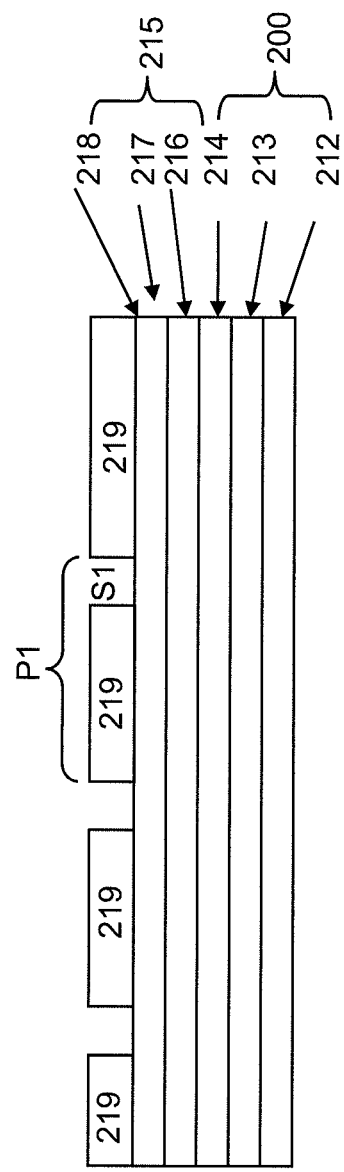

Referring to FIG. 10, upper layer 218 of the first imaging layer 215 is patterned by photolithography patterning processes. The processes may include exposure, post-exposure baking, developing the photoresist, rinsing, drying (e.g., hard baking), other suitable processes, and/or combinations thereof. The patterned upper layer 218 comprises a plurality of first features 219 directly over the middle layer 217. A pitch P1 on each of the first features 219 is the minimum distance between the same points of two adjacent first features 219. The pitch P1 equals a width W1 of the first feature 219 plus a space S1 between adjacent the first features 219.

Figure 11:
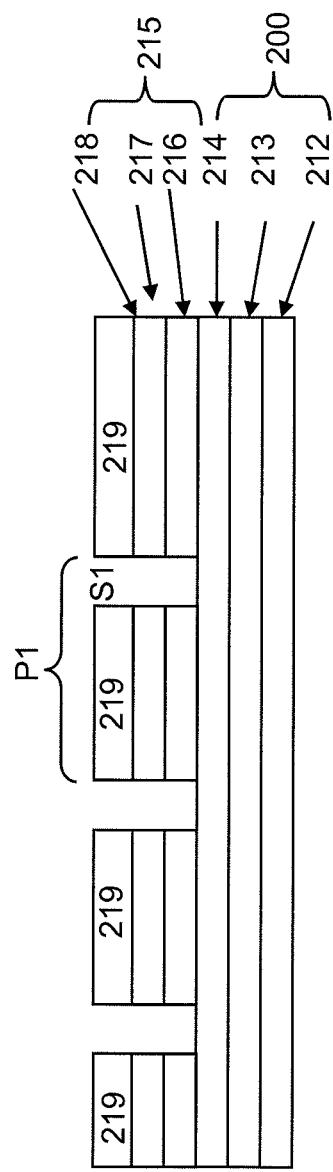

Referring to FIG. 11, the middle layer 217 and the bottom layer 216 are patterned by using the upper layer 218 as a mask. The first features 219 are transferred into the middle layer 217 and the bottom layer 216. In one embodiment, an inorganic Si-containing ARC layer is used as the middle layer 217. An organic bottom anti-reflective coating layer (BARC) is used as the bottom layer 216. The middle layer 217 is etched with a plasma process in a $CF_4$ ambient environment. Then, the bottom layer 216 is etched with a plasma process in a $HBr/O_2$ ambient environment. In one embodiment, the upper layer 218 is consumed and removed during the bottom layer 216 etching process.

Figure 12:
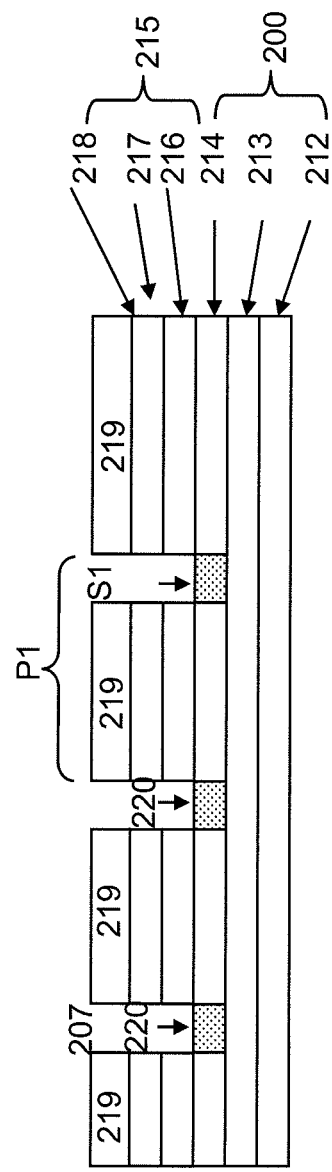
Figure 13:
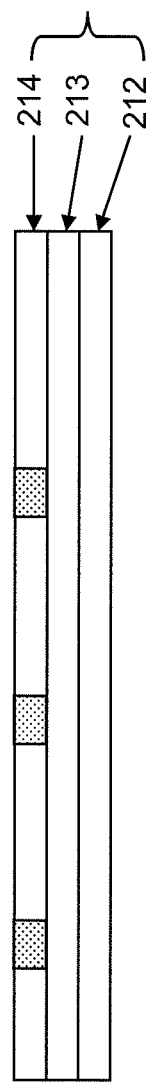

Next, as shown in FIG. 12, once the three layers, 216, 217, and 218 have been patterned as described above, they form features 219 in the patterned first image layer 219. Next, ions 207 are implanted into the unmasked regions of polysilicon layer 214. In this embodiment, ions 207 are implanted vertically into the polysilicon layer 214. The ion implantation operation is conducted with conventional ion implantation methods and the implantation parameters can be varied as discussed above. Due to the presence of the first tri-layer image layer 215, the ion implantation affects only the portions of the polysilicon layer 214 that is unmasked. Therefore, as FIG. 12 shows, the implantation operation forms evenly spaced implanted features 220 in the polysilicon layer 214; each implanted feature 220 has a width of S1. Referring to FIG. 13, once the ion implantation operation has been conducted, the first tri-layer image layer 215 is removed.

Figure 14:
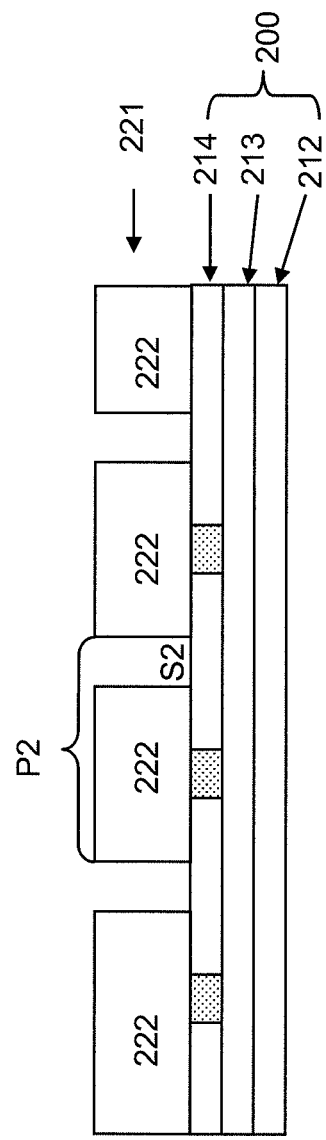

Next, as FIG. 14 shows, a second image layer 221 is deposited onto the polysilicon layer 214. The second image layer 221 also has three layers same as the first image layer 215. The second image layer 221 is also patterned in much the same way as the first image layer 215, forming second features 222 in the second image layer 221.

Each of the adjacent second features 222 has the pitch P2, the width W2, and the space S2. In this embodiment, the pitch P2 and the first pitch P1 in the previous image layer are substantially equal. In this embodiment, the pitch P2 equals the width W2 of the second feature 222 plus the space S2 between the adjacent second features 222. Also, in this embodiment, spaces S2 of the second photoresist layer 221 expose the portions of the polysilicon layer 214—the portions of the polysilicon layer 214 that will be subject to the second ion-implantation. In other words, the width of space S2 determines the width of the portion of polysilicon layer 214 to be implanted for the second time.

Again, same as the previous embodiment, the positioning of the second features 222 in the second image photoresist layer 221 is important, because it has a direct impact on the sizing and spacing of the resulting polysilicon features. In this embodiment, the width W2 of the second photoresist feature 222 is again set at three times the width S2, and the photoresist feature 222 is positioned on the polysilicon layer 214 such that the amount of a photoresist feature 222 on either side of the previously implanted polysilicon feature 216 in the first photoresist layer 215 is the same. This configuration ensures that all of the resultant implantation-features in the resultant polysilicon layer 214, after two implantation operations, are evenly spaced.

Figure 15:
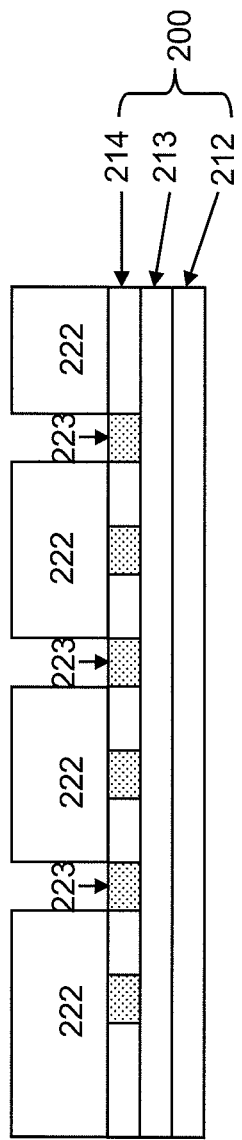
Figure 16:
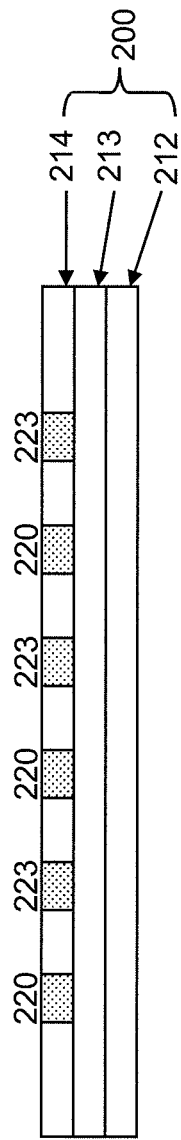
Figure 17:
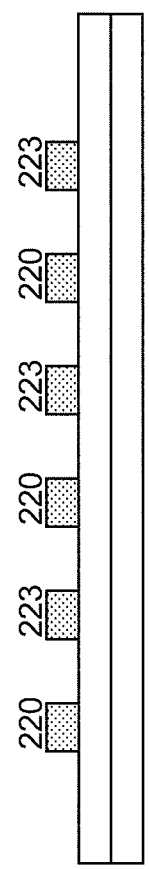

Next, as FIG. 15 shows, the second ion-implantation operation is conducted. The second ion-implantation operation creates a set of second ion-implanted features 223 in the polysilicon layer 214. Just like the previous embodiment, due to the careful positioning of the second features 222 in the second photoresist layer and the sizing of the photoresist features 222 described above, the second ion-implanted features 223 should have identical widths (S2) and all of the first and second ion-implanted features 220 and 223 should be spaced evenly apart at a distance equals to one third of W2. Finally, as FIG. 16 shows, the second image layer is removed and the non-implanted portions of the polysilicon layer 214 is etched away using TMAH (see FIG. 17).

An aspect of the present application relates to method of making a semiconductor structure, the method including forming a conductive layer over a substrate. The method further includes forming a first imaging layer over the conductive layer, where the first imaging layer comprises a plurality of layers. The method further includes forming openings in the first imaging layer to expose a first set of areas of the conductive layer. The method further includes implanting ions into each area of the first set of area. The method further includes forming a second imaging layer over the conductive layer. The method further includes forming openings in the second imaging layer to expose a second set of areas of the conductive layer, wherein the second set of areas is different from the first set of areas. The method further includes implanting ions into the each area of the second set of areas. The method further includes removing the second imaging layer from the conductive layer. The method also includes removing portions of the conductive layer having an ion concentration below a threshold ion concentration.

Another aspect of the present application relates to a method of making a semiconductor structure, the method including forming a gate dielectric layer over a substrate and retaining the gate dielectric layer in contact with the substrate. The method further includes forming a conductive layer over the substrate. Additionally, the method includes forming a multi-layered imaging layer on the conductive layer. Moreover, the method includes patterning the multi-layered imaging layer to expose a first plurality of areas of the conductive layer. Furthermore, the method includes implanting ions into each area of the first plurality of areas. Also, the method includes removing the multi-layered imaging layer. Furthermore, the method includes forming a second imaging layer directly on the conductive layer. Furthermore, the method includes patterning the second imaging layer to expose a second plurality of areas of the conductive layer. The method includes implanting ions into each area of the second plurality of areas. Furthermore, the method includes removing the second imaging layer. Also, the method includes removing portions of the conductive layer outside the first plurality of areas and the second plurality of areas.

Still another aspect of the present application relates to a method of making a semiconductor structure including forming a conductive layer over a substrate. The method includes forming a first imaging layer over the conductive layer, where forming the first imaging layer includes forming a first layer directly on the conductive layer, forming a second layer over the first layer, and forming a first photoresist layer over the second layer. The method continues with patterning the first photoresist layer. The method includes removing portions of the first layer and the second layer using the first photoresist layer as a mask to expose a first set of areas of the conductive layer. Also, the method includes implanting ions in each area of the first set of areas of the conductive layer to increase an ion dopant concentration in each area of the first set of areas to a first ion concentration greater than a threshold ion concentration. Furthermore, the method includes removing remaining areas of the first imaging layer. Additionally, the method includes forming a second imaging layer over the conductive layer, the second imaging layer including a second photoresist. The method includes patterning the second photoresist layer. Additionally, the method includes removing portions of the second imaging layer to expose a second set of areas of the conductive layer. Furthermore, the method includes implanting ions in each area of the second set of areas of the conductive layer to increase an ion dopant concentration in each area of the second set of areas to a second ion concentration greater than the threshold ion concentration. Moreover, the method includes removing the second imaging layer. Also, the method includes removing portions of the conductive layer having an ion concentration below the threshold ion concentration.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of making a semiconductor structure, the method comprising:
    forming a conductive layer over a substrate;
    forming a first feature and a second feature over the conductive layer, wherein the first and second features have a first pitch and a first space interposing the first and second features;

while using the first and second features as a masking element, implanting ions into the conductive layer underlying the first space to form a first ion-implanted feature;

forming a third feature and a fourth feature over the conductive layer including the first ion-implanted feature, wherein the third feature and the fourth feature have a second pitch and a second space interposing;

while using the third and fourth features as a masking element, implanting ions into the conductive layer underlying the second space to form a second ion-implanted feature, wherein the second ion-implanted feature is spaced a distance from the first ion-implanted feature, wherein the distance is one third of the difference between the second pitch and the second space; and using an etching process of applying an etchant having an etch selectivity to an ion concentration of the conductive layer to remove portions of the conductive layer while maintaining the first ion-implanted feature and the second ion-implanted feature.

2. The method of claim 1, wherein the forming the conductive layer includes depositing polysilicon.

3. The method of claim 2, wherein the implanting ions underlying the first space and underlying the second space includes implanting ions into the polysilicon.

4. The method of claim 3, wherein the using the etching process includes performing a wet etch using an etchant comprising at least one of TMAH, NaOH, KOH, or NH4OH.

5. The method of claim 1, wherein a width of the third feature is defined as the second pitch minus the second space, wherein the width of the third feature is three times the second space.

6. The method of claim 1, wherein forming the first feature and second feature includes:
    forming a bottom layer, wherein the bottom layer comprises an anti-reflective coating material;
    depositing a middle layer over the bottom layer; and
    forming an upper layer over the middle layer, wherein the upper layer comprises an organic layer.

7. The method of claim 1, wherein the first ion-implanted feature has an ion dose of greater than $10^{20}$ ions/cm$^2$.

8. A method of making a semiconductor structure, the method comprising:
    forming a conductive layer over a substrate;
    forming a first patterned masking layer over the conductive layer;
    performing a first implant by implanting ions into each area of a first plurality of areas defined by the first patterned masking layer;
    after performing the first implant, forming a second patterned masking layer over the conductive layer;
    performing a second implant by implanting ions into each area of a second plurality of areas defined by the second patterned masking layer; and
    applying an etchant providing an etch rate of the conductive layer that is selective to an amount of implanted ions to selectively remove portions of the conductive layer outside the first plurality of areas and the second plurality of areas, wherein at least a portion of the removed portions are portions of the conductive layer having been masked during each of the first implant and the second implant.

9. The method of claim 8, wherein the forming the first patterned masking layer includes forming a multi-layered imaging layer over the conductive layer.

10. The method of claim 8, wherein a first pitch between two closest areas of the first plurality of areas and a second pitch between two closest areas of the second plurality of areas are substantially equal.

11. The method of claim 8, wherein the first implant implants boron, arsenic, phosphorous, nitrogen, helium, carbon, silicon, or difluoroborane.

12. The method of claim 8, wherein the etchant comprises at least one of TMAH, NaOH, KOH, or NH4OH.

13. The method of claim 8, wherein the forming the first patterned masking layer includes forming a multi-layered imaging layer comprising a plurality of organic layers.

14. The method of claim 8, wherein the performing the second implant comprises vertically implanting the ions.

15. A method of making a semiconductor structure, the method comprising:
    forming a conductive layer over a substrate, wherein an ion concentration of the conductive layer is below a threshold ion concentration;
    forming a mask over the conductive layer to expose a first set of areas of the conductive layer while the mask overlies a remaining portion of the conductive layer;
    implanting ions in each area of the first set of areas of the conductive layer to increase an ion dopant concentration in each area of the first set of areas to be greater than the threshold ion concentration;
    after removing the mask, forming a second mask over the conductive layer to expose a second set of areas of the conductive layer, where the second set of areas are a first portion of the remaining portion of the conductive layer;
    implanting ions in each area of the second set of areas of the conductive layer to increase an ion dopant concentration in each area of the second set of areas to be greater than the threshold ion concentration, wherein during the implanting ions into the second set of areas the second mask overlies the first set of areas and a second portion of the remaining portion of the conductive layer; and
    using an etching process after the implanting the first set of areas and the second set of areas, removing the conductive layer having an ion concentration below the threshold ion concentration by applying an etchant having a composition with an etch selectivity that etches the conductive layer having an ion dopant concentration less than the threshold ion concentration and substantially does not etch the conductive layer having an ion dopant concentration greater than the threshold ion concentration.

16. The method of claim 15, wherein the implanting ions includes implanting at least one of boron, arsenic, phosphorous, nitrogen, helium, carbon, or difluoroborane.

17. The method of claim 16, wherein the conductive layer includes polysilicon.

18. The method of claim 15, wherein the implanting ions includes implanting silicon.

19. The method of claim 15, further comprising: forming a gate dielectric layer prior to forming the conductive layer.

20. The method of claim 19, wherein the conductive layer is formed directly interfacing the gate dielectric layer.

* * * * *